US009634090B2

United States Patent
Rim et al.

(10) Patent No.: US 9,634,090 B2
(45) Date of Patent: Apr. 25, 2017

(54) PREVENTING BURIED OXIDE GOUGING DURING PLANAR AND FINFET PROCESSING ON SOI

(71) Applicant: International Business Machines Corporation, Armonk, NY (US)

(72) Inventors: Kern Rim, Yorktown Heights, NY (US); Junli Wang, Singerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/142,145

(22) Filed: Apr. 29, 2016

(65) Prior Publication Data

US 2016/0247877 A1    Aug. 25, 2016

Related U.S. Application Data

(62) Division of application No. 14/603,624, filed on Jan. 23, 2015.

(Continued)

(51) Int. Cl.
| | |
|---|---|
| *H01L 29/06* | (2006.01) |
| *H01L 21/308* | (2006.01) |
| *H01L 23/29* | (2006.01) |
| *H01L 21/84* | (2006.01) |
| *H01L 29/66* | (2006.01) |

(Continued)

(52) U.S. Cl.
CPC ........ *H01L 29/0649* (2013.01); *H01L 21/308* (2013.01); *H01L 21/3081* (2013.01); *H01L 21/3085* (2013.01); *H01L 21/845* (2013.01); *H01L 23/291* (2013.01); *H01L 27/1211* (2013.01); *H01L 29/66795* (2013.01); *H01L 29/66818* (2013.01); *H01L 29/785* (2013.01); *H01L 2924/0002* (2013.01)

(58) Field of Classification Search
CPC .................................................. H01L 29/0649
See application file for complete search history.

(56) References Cited

U.S. PATENT DOCUMENTS

| | | | | |
|---|---|---|---|---|
| 2014/0312420 | A1* | 10/2014 | Adam | H01L 27/1211 257/347 |
| 2015/0162404 | A1* | 6/2015 | Yang | H01L 21/823431 257/401 |

OTHER PUBLICATIONS

List of IBM Patents or Patent Applications Treated As Related—Date Filed: May 4, 2016; 1 page.

(Continued)

*Primary Examiner* — Dung Le
(74) *Attorney, Agent, or Firm* — Cantor Colburn LLP; Vazken Alexanian

(57) ABSTRACT

A method for preventing damage to the insulator layer of a semiconductor device during creation of fin field effect transistor (FinFET) includes obtaining a material stack having an active semiconductor layer, an insulator layer, and an etch stop layer between the active semiconductor layer and the insulator layer; forming a fin-array from the active semiconductor layer; patterning the fin-array; and fabricating a FinFET device from the patterned fin-array; where the etch stop layer is resistant to processes the etch stop layer is exposed to during the forming, patterning, and fabricating operations, such that the etch stop layer and the insulator layer are not damaged during the forming, patterning, and fabricating operations.

5 Claims, 7 Drawing Sheets

Related U.S. Application Data

(60) Provisional application No. 61/987,671, filed on May 2, 2014.

(51) Int. Cl.
*H01L 29/78* (2006.01)
*H01L 27/12* (2006.01)

(56) References Cited

OTHER PUBLICATIONS

Rim, Kern, et al.; Preventing Buried Oxide Gouging During Planar and FINFET Processing on SOI; U.S. Appl. No. 14/603,624, filed Jan. 23, 2015.

* cited by examiner

PREVENTING BURIED OXIDE GOUGING DURING PLANAR AND FINFET PROCESSING ON SOI

DOMESTIC PRIORITY

This application is a continuation of and claims priority to U.S. Nonprovisional application entitled "PREVENTING BURIED OXIDE GOUGING DURING PLANAR AND FINFET PROCESSING ON SOI," filed Jan. 23, 2015, which claims priority to U.S. Provisional Application No. 61/987,671, entitled "STRUCTURE AND METHOD TO PREVENT BURIED OXIDE GOUGING DURING PLANAR AND FINFET PROCESSING ON SOI," filed May 2, 2014, which is incorporated herein by reference in its entirety.

BACKGROUND

The present invention relates generally to semiconductor and microelectronic structures and methods for fabricating these structures. More particularly, the invention relates to methods, and structures, which prevent the insulator layer from being damaged during the creation of fin field effect transistor devices.

The use of a semiconductor fin-type field effect transistor (FinFET) has been found to provide many benefits to microelectronic devices. FinFETs allow an increase in transistor density, an improvement in the electrical characteristics of individual transistors, and advancement in the overall performance of microelectronic devices. However, the processes used for the manufacture of fins for FINFET devices have presented a number of difficulties that adversely affect the physical and electrical performance of the resulting FinFET device.

During fabrication of a FinFET, a material stack is formed using processes known in the art to layer selected materials one on top of the other. Typically, a material stack intended for FinFET fabrication includes at least a substrate layer, an insulator layer and an active semiconductor layer. During manufacture of a FinFET from a material structure, a plurality of fins are formed from the material stack by applying processes, such as those known in the art as etches and cleans, to the active semiconductor layer. These processes are utilized to form a plurality of vertical semiconductor structures from the active semiconductor layer. The resulting vertical semiconductor structures are the individual fins for FinFET devices. A plurality of fins is often referred to as a fin-array, which is typically then patterned by applying further processes known in the art to remove un-needed fins. Typically the processes utilized are selected based on the chemical and physical properties of the processes, as well as the chemical and physical properties of the materials included in the material stack.

The processes used in the fabrication of fins for FinFET devices have proved capable of providing both benefits for, and defects in, the resulting fin structures. For example, processes utilized to pattern a fin-array can result in gouging the insulator layer due to the chemical properties of the processes used and the chemical composition of the insulator layer. Gouging typically creates irregular topography on the surface of the insulator layer. The presence of irregularities on the surface of the insulator layer has been found to greatly increase the likelihood of voids forming during subsequent material depositions. And the presence of voids has been known to result in the degradation of the electrical properties and obstruction of the performance of the resulting microelectronic device.

Gouging, however, is not the only problem that results when processes, such as etches and cleans, remove some of the insulator layer. Processes utilized to prepare for gate dielectric formation can also remove some of the insulator layer, thereby undercutting the fin due to the interaction between the chemical makeup of the insulator layer and the unique chemistry of the processes. Undercutting is often the result of applying etches and cleans during the formation of a gate over a fin of a FinFET, which may involve etching away semiconducting material or other material applied during manufacturing processes. Undercutting is capable of improving gate control, but can also undermine fin stability and introduce defects into the resulting FinFET structure. Undercutting has been found to cause physically weaker connections between the fin and the underlying layer, which can fatally reduce the stability of the affected fin to the point of physical failure. Undercutting can also create difficulties for subsequently removing material that becomes deposited within the undercut region, and such deposited material can significantly alter the affected fins electrical performance, such as causing gate to gate electrical shorts.

SUMMARY

Embodiments of the present invention provide a method for preventing damage to the insulator layer of a semiconductor device during the creation of a fin field effect transistor (FinFET) device. The method includes obtaining a material stack having an active semiconductor layer, an insulator layer, and an etch stop layer existing between the active semiconductor layer and the insulator layer; forming a fin-array from the active semiconductor layer by applying fin-array formation processes to the material stack, with the etch stop layer resistant to a process of the fin-array formation processes that the etch stop layer is exposed to, such that the etch stop layer and the insulator layer are not damaged during fin-array formation; patterning the fin-array by applying fin-array patterning processes after the fin-array has been formed from the active semiconductor layer, with the etch stop layer resistant to a process of the fin-array patterning processes that the etch stop layer is exposed to, such that the etch stop layer and the insulator layer are not damaged during fin-array patterning; and fabricating a FinFET device by applying FinFET fabrication processes after the fin-array has been patterned by the fin-array patterning processes, with the etch stop layer resistant to a process of the FinFET fabrication processes that the etch stop layer is exposed to, such that the etch stop layer and the insulator layer are not damaged during FinFET fabrication.

Embodiments of the present invention also provide a structure, for creating a semiconductor device without damaging the insulator layer during creation of fin field effect transistor devices. The structure includes: an insulator layer; an active semiconductor layer; an etch stop layer existing between the insulator layer and the active semiconductor layer and being of material resistant to processes that the etch stop layer is exposed to during creation of a FinFET having fins formed from the active semiconductor layer, such that the etch stop layer and the insulator layer are not damaged during creation of the FinFET.

Embodiments of the present invention further provide a structure, for creating a semiconductor device without damaging the insulator layer during creation of fin field effect transistor devices. The structure includes: an insulator layer;

a patterned fin-array of active semiconductor material; an etch stop layer existing between the insulator layer and the patterned fin-array, and being of material resistant to processes that the etch stop layer was exposed to during formation and patterning of the patterned fin-array as well as processes that the etch stop layer will be exposed to during fabrication of a FinFET device having a fin of the patterned fin-array, such that the etch stop layer and the insulator layer are not damaged during processes for formation, patterning and fabrication.

DETAILED DESCRIPTION

Figure 1:
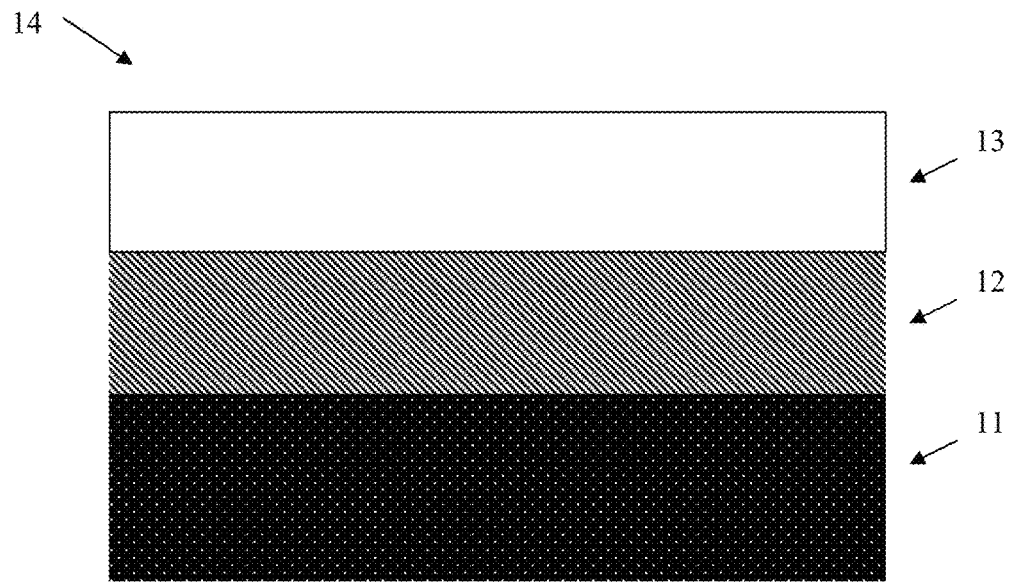
FIG. 1 shows a conventional material stack prior to application of fin-array formation processes.

In view of the above, embodiments of the present invention address the above described deficiencies by a method and apparatuses capable of preventing the insulator layer from being damaged during the creation of FinFET devices.

It will be readily understood that the components of the present invention, as generally described and illustrated in the figures herein, may be arranged and designed in a variety of different configurations in addition to the described presently preferred embodiments. Thus, the following detailed description of the embodiments of the present invention, as represented in the figures, is not intended to limit the scope of the invention, as claimed, but is merely representative of selected presently preferred embodiments of the invention. The following description is intended only by way of example, and simply illustrates certain selected presently preferred embodiments of the invention as claimed herein.

Implementations consistent with the present invention provide a patterned array of FinFET fins for FinFET applications, that has been formed using a material stack that employs a non-sacrificial etch stop layer to prevent gouging and undercutting. In one aspect of the invention a material stack is obtained having at least an active semiconductor layer separated from an insulator layer by at least an etch stop layer. Subsequent processes conventionally known in the art, such as etches and cleans, are applied to the material stack to form a fin-array without damaging the insulator layer. Further processes conventionally known in the art are applied to the material stack that has been formed into a fin-array such that the fin-array is patterned to remove unneeded fins without damaging the insulator layer.

Accordingly, the material that forms the etch stop layer possesses sufficient properties such that the processes that will be applied to the material stack to form and pattern one or more vertical structures, such as fins, from the active semiconductor layer will not result in damaging the insulator layer. And the material that forms the etch stop layer possesses sufficient properties such that further processes applied to the fins to create FinFET devices will not result in undercutting the fins.

As is known in the art, one or more patterned photo-resist layers can be used as etch masks to pattern and etch the active semiconductor layer to form and pattern a plurality of vertical semiconductor fin structures. Furthermore, the fin structures may be etched using any conventional etch process, including but not limited to, anisotropic etching processes such as reactive ion etching or the like. Thereafter, depending on the final design implementation, the resulting patterned fin-array may be used to fabricate one or more FinFET devices.

The materials used in the method and apparatuses described herein may comprise materials with appropriate etch selectivity properties or other appropriate properties and are not limited to those materials specifically referenced herein. Accordingly, various wet and dry etches can be used in the processes describe herein to remove any portion of the material stack, or to remove any portion of additional material layers that may be required, and such etches can possess chemistries suitable for creating the patterned fin-array while leaving the insulator layer undamaged due to the chemical composition of the etch stop layer.

FIGS. 1-5 illustrate, in cross section, the initial operations in a process conventionally known in the art for creating a FinFET device from a silicon on insulator (SOI) wafer with particular attention given to the processes conducted for fabrication of a patterned fin-array.

Referring to FIG. 1, a conventional semiconductor material stack 14 is illustrated as an example of the prior art. The material stack includes a substrate layer 11, an insulator layer 12, and an active semiconductor layer 13. As is known in the art, a SOI material stack can be used. As typical for a SOI material stack a layer of silicon is provided as the substrate layer 11, a buried oxide layer (BOX) of silicon oxide (SiO$_2$) is provided as the insulator layer 12, and another layer of silicon (Si) is provided as the active semiconductor layer 13.

As is known in the art, the semiconductor layer can be any semiconductor material, either doped or undoped, including but not limited to silicon, silicon germanium, germanium, silicon carbide, a III-V compound semiconductor, a II-VI compound semiconductor, a carbon-based semiconductor such as a carbon nanotube or graphene, an organic semiconductor, or any multilayer or other combination of these. Similarly, the substrate and insulator layers are also not limited to those materials specifically stated in the prior art example.

Figure 2:
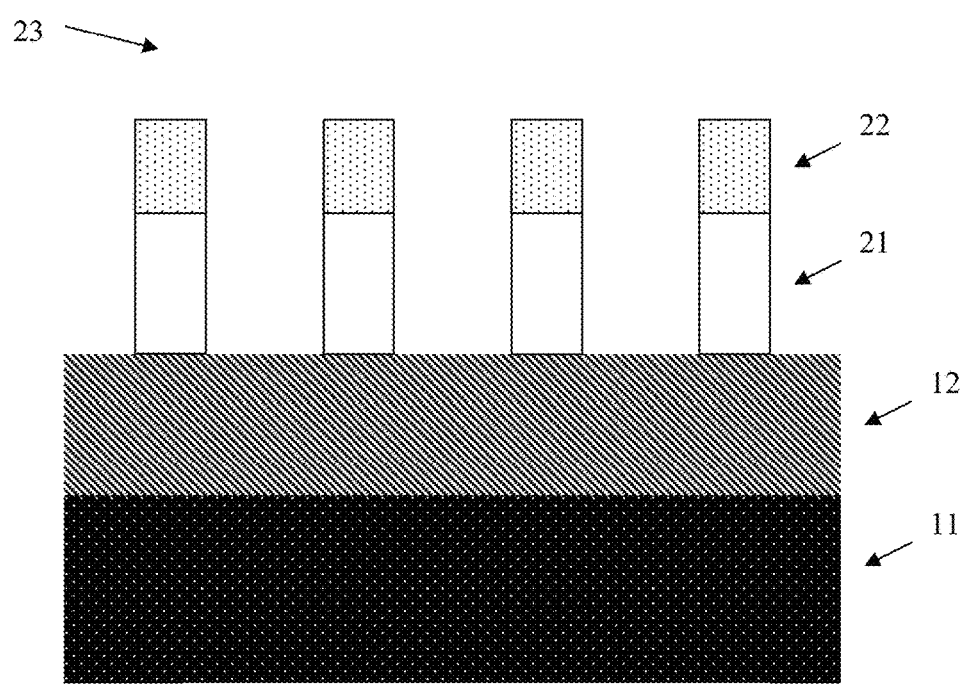
FIG. 2 shows a conventional material stack after fin-array formation processes have been applied to create a fin-array with the addition of a mask layer.

Referring to FIG. 2, the material stack 14 as shown in FIG. 1 is illustrated as having been processed into a fin-array 23 of a plurality of fins 21. As applied in the prior art to an SOI wafer, the processes result in silicon fins 21 that are in contact with the insulator layer 12 of SiO$_2$, having been etched from the active semiconductor layer 13 of Si using conventional vertical semiconductor device fabrication processes known in the art, such as reaction ion etching (ME). As is known in the art, this processing can be accomplished utilizing a spacer image transfer technique and, as a result of the processes applied, the silicon fins 21 are shown as having been capped with a fin hard mask layer 22. In the example of an SOI wafer, the fin hard mask layer 22 may typically be SiO$_2$ or SiN. As is know in the art, various etching and cleaning processes may be applied to the material stack 14 to form a plurality of fins 21 that makeup a fin-array 23.

Figure 3:
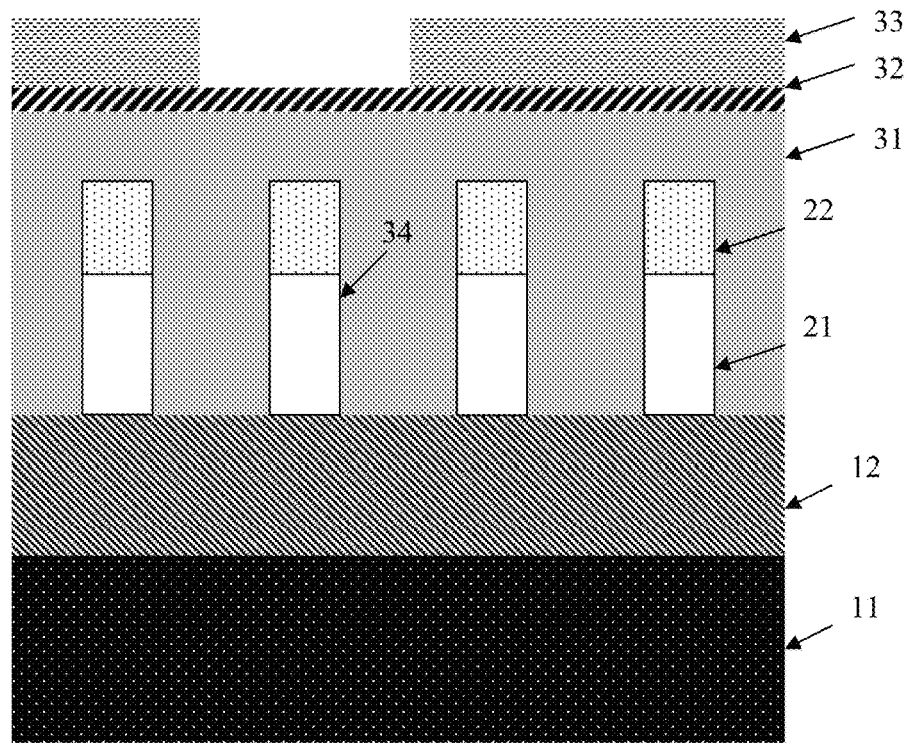
FIG. 3 shows a fin-array with additional mask layer after further material layers have been deposited in preparation for the application of processes to pattern the fin-array.

Referring to FIG. 3, the fin-array 23 as shown in FIG. 2, is illustrated as having had various layers of additional materials deposited by further semiconductor device fabrication processes known in the art as needed to prepare the fin-array 23 for patterning processes. Patterning is typically accomplished by removing any un-needed fins 34. In the prior art the additional layers as typically being applied to an SOI wafer for example are an optical planarization layer (OPL) 31, a silicon antireflective coating (SiARC) layer 32, and a patterned photoresist layer 33. The patterned photoresist layer is used as part of the patterning process by exposing the OPL 31 and SiARC layer 32 to conventional vertical anisotropic etching processes, such as a tri-layer litho open process. As is know in the art, various processes and materials may be applied to the material stack 14 to form and pattern a fin-array 23.

Figure 4:
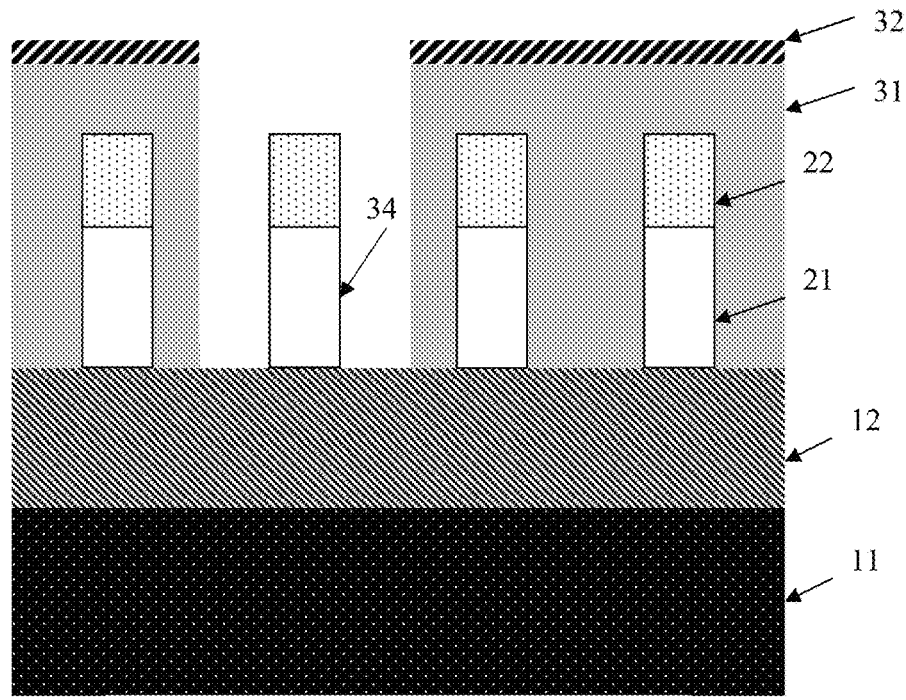
FIG. 4 shows a fin-array and additional mask layer after some of the processes for patterning the fin-array have uncovered the unneeded fins.

Referring to FIG. 4, the unneeded fins 34 with additional fin hard mask cap 22, which need to be removed in order to create the intended patterned fin-array, have been uncovered by applying conventional anisotropic etching processes to the additional layers in order to selectively remove the additional layers from the area of the unneeded fins 34. In the prior art example utilizing an SOI wafer, an OPL layer 31, and an SiARC layer 32, reactive ion etching (RIE) may be used to complete this process.

Figure 5:
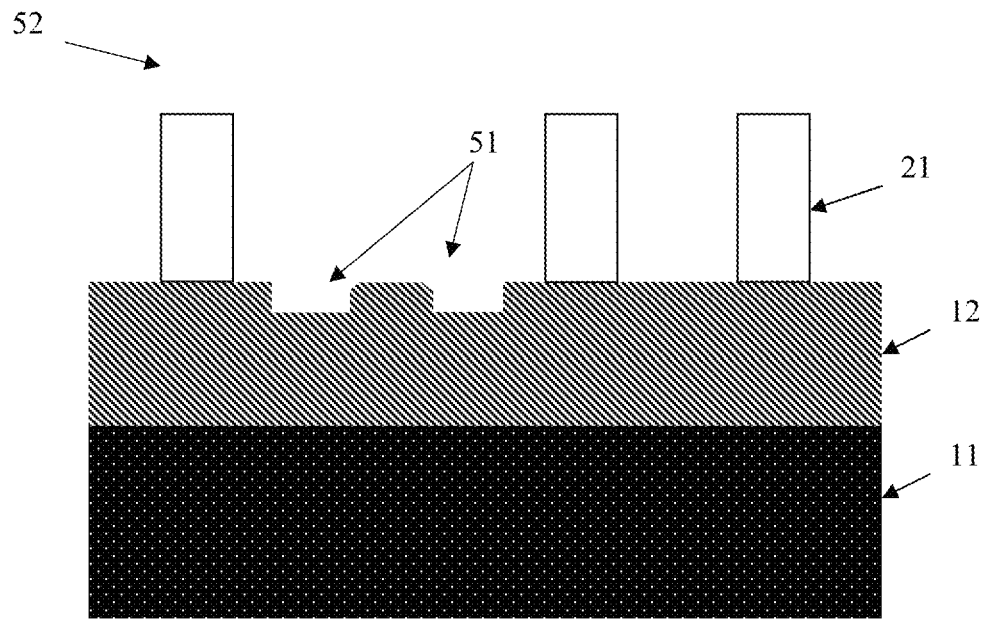
FIG. 5 shows a conventional material stack after a fin-array has been formed and patterned resulting in a patterned fin-array having gouging at the insulator layer surface.

Referring to FIG. 5, multiple processes known in the art have been applied to remove the uncovered fin, and the additional layers, to form a patterned fin-array 52. In this example utilizing a SOI wafer the processes resulted in SiARC layer burnoff, OPL strip, hard mask etch, and removal of the uncovered Si fins. However, because of the chemical makeup of the insulator layer 12, such as silicon oxide, and the chemical properties of the processes used, such as reactive ion etching, the insulator layer has been etched as well. Etching of the insulator layer has resulted in visible damage to the topography of the insulator layer, such as gouging 51 of the insulator layer 12.

Figure 6:
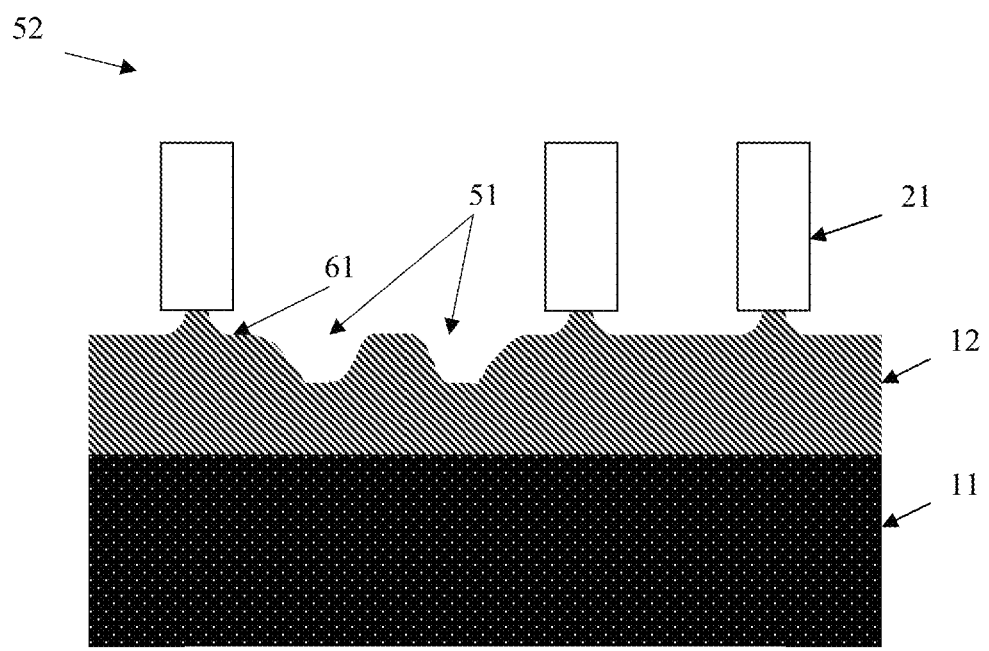
FIG. 6 show a conventional material stack after a fin-array has been formed, patterned and subject to processes applied for gate formation, resulting in a patterned fin-array having gouging at the insulator layer surface and undercutting at interface of the fins and insulator layer.

Referring to FIG. 6, additional processes known in the art have been applied to accomplish gate formation (not shown) as part of fabricating FinFET devices from the patterned fin-array 52, and some of these additional processes have resulted in undercut 61 to develop at the interface of the fin 21 and insulator 12. In this example that utilizes a SOI wafer, some of the processes applied to accomplish gate formation had chemical properties such that insulator layer 12 was partially removed, which resulting in furthering the gouges 51 and developing undercut 61 at the fin 21 and insulator layer 12 interface. Specific examples of such processes known in the art include cleaning prior to epitaxy growth at the source drain area and cleaning prior to gate dielectric formation. During epitaxy growth, SiGe or Si epitaxy usually is used to merge a fin outside of gate and spacer. However, epitaxy growth requires a cleaning operation be performed first. This pre-clean operation will typically etch oxide materials, such as the insulator between and under fins. Furthermore, before a gate dielectric is formed, a multi-step cleaning process is needed to clean the fin surface. Such fin surface cleaning will expose the insulator material to processes that will also etch oxide materials, such as the insulator between and under fins.

The resulting damage described as occurring during the processes in the prior art for patterned fin-array formation and preparation for epitaxy growth and gate formation (not shown) are sought to be prevented by the present invention. Advantages and features of the present invention will become readily apparent to those skills in the art from the following detailed descriptions. The embodiments shown and describe provide illustration of preferred methods and structures for enabling those skilled in the art to carry out the present invention. The invention is capable of modifications in various respects, all without departing from the invention. Accordingly, the figures are to be regarded as illustrative in nature, and not restrictive.

FIGS. 7-11 illustrate, in cross-section, initial operations for creating a FinFET device from a material stack, exemplifying a preferred embodiment of the present invention concerning methods and apparatuses implemented during creation of a patterned fin-array without incurring damage known in the art to result from applying conventional processes to a material stack to create a FinFET device.

Figure 7:
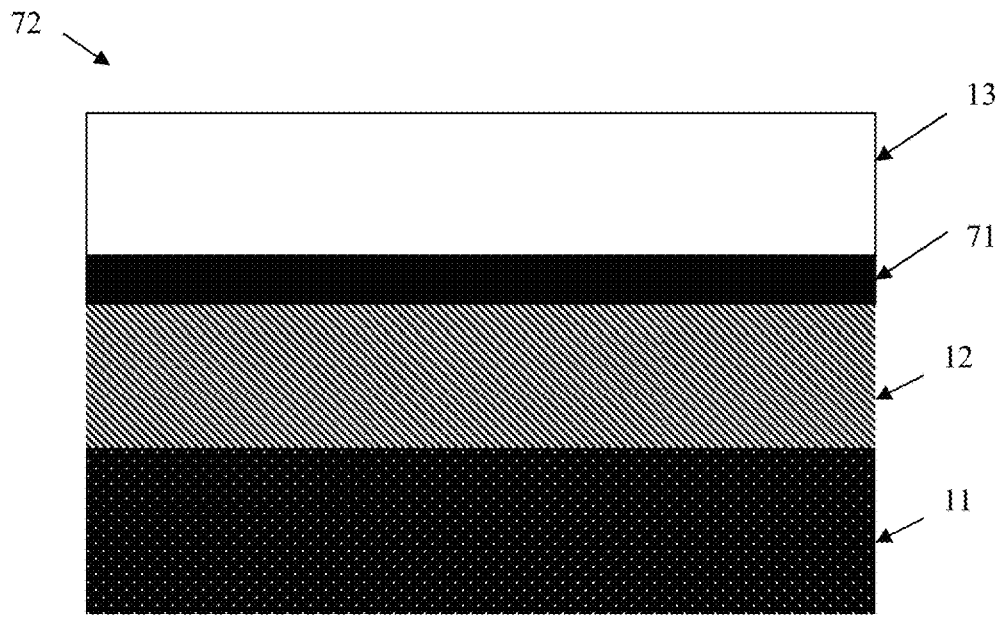
FIG. 7 shows an embodiment of the present invention prior to application of processes for forming a fin-array.

Referring to FIG. 7, an embodiment of the present invention is illustrated as a material stack 72 that includes an insulator layer 12, an active semiconductor layer 13, and an etch stop layer 71 interposed between them such that the etch stop layer is in contact with the active semiconductor layer 13 and the insulator layer 12. The etch stop layer 71 may have various thicknesses based on the desired application, preferably within the range of about 0 and 50 nanometers. The etch stop layer 71 is made of material having properties, for example a material having a high-k value, such that neither the insulator layer 12 nor etch stop layer 71 will be damaged by processes that the insulator layer 12 would otherwise be exposed to during the creation of a patterned fin-array and formation of gate. In accordance with an embodiment of the present invention, a method for preventing damage to the insulator layer 12 of a semiconductor device during creation of fin field effect transistor devices includes obtaining a material stack 72 including at least an active semiconductor layer 13, an insulator layer 12, and an etch stop layer 71 existing between the active semiconductor layer 13 and the insulator layer 12.

In a preferred embodiment the insulator layer 12 is silicon oxide (SiO$_2$), the active semiconductor layer 13 is silicon (Si), and the etch stop layer 71 is hafnium oxide (HfO$_2$). The insulator layer 12 is in contact with the etch stop layer 71, and the etch stop layer 71 is also in contact with the active semiconductor layer 13, such that the insulator layer 12 and the active semiconductor layer 13 are not in contact. The etch stop layer 71 of HfO$_2$ can be added through processes known in the art, such as thermal growth or deposition, during wafer bonding typically utilized to create a conventional SOI wafer. The etch stop layer 71 has a preferred thickness of 5 nanometers. However, other embodiments are capable of being made such that the etch stop layer is not limited to HfO$_2$ or a thickness of 5 nanometers, and can be made of other materials that are not susceptible to degradation, or destruction, by the processes, such as etches and cleans, that the insulator layer would other wise be exposed to. Some other such materials that could form the etch stop layer are, but not limited to, Al$_2$O$_3$, ZrO$_3$, La$_2$O$_3$, and HfSiO$_x$.

Figure 8:
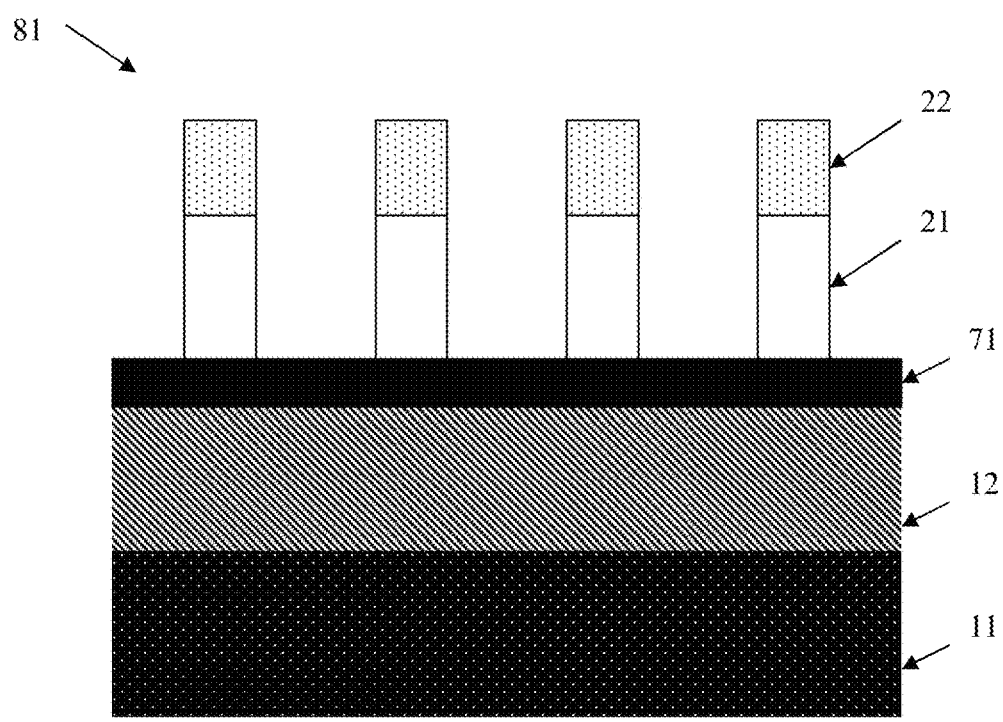
FIG. 8 shows an embodiment of the present invention after fin-array formation processes have been applied to create a fin-array with an additional mask layer.

Referring to FIG. 8, the material stack 72 has had conventional etch processes known in the art applied in order to create fins 21 from the active semiconductor layer 13. Multiple fins 21 exist across the etch stop layer 71, forming a fin-array 81. In accordance with an embodiment of the present invention, a method for preventing damage to the insulator layer of a semiconductor device during creation of a fin field effect transistor device includes forming a fin-array 81 from the active semiconductor layer 13 by applying processes to the material stack 72 and the etch stop layer is resistant to those processes of the fin-array formation processes that the etch stop layer 71 is exposed to, such that the etch stop layer 71 and the insulator layer 12 are not damaged during formation of the fin-array 81.

In a preferred embodiment, the active semiconductor layer 13 is made of silicon and is subjected to the conventional process of spacer image transfer techniques as are known in the art. The active semiconductor layer 13 of silicon is processed into silicon fins 21, capped with a hard mask layer 22 of either silicon oxide (SiO$_2$) or silicon nitride (SiN). The silicon fins 21 are in contact with the etch stop layer 71 of HfO$_2$ and form a fin-array 81 of silicon fins 21. The etch stop layer 71 and the insulator layer 12 are not damaged by the processes utilized to form the fin-array 81 from the active semiconductor layer 13.

Figure 9:
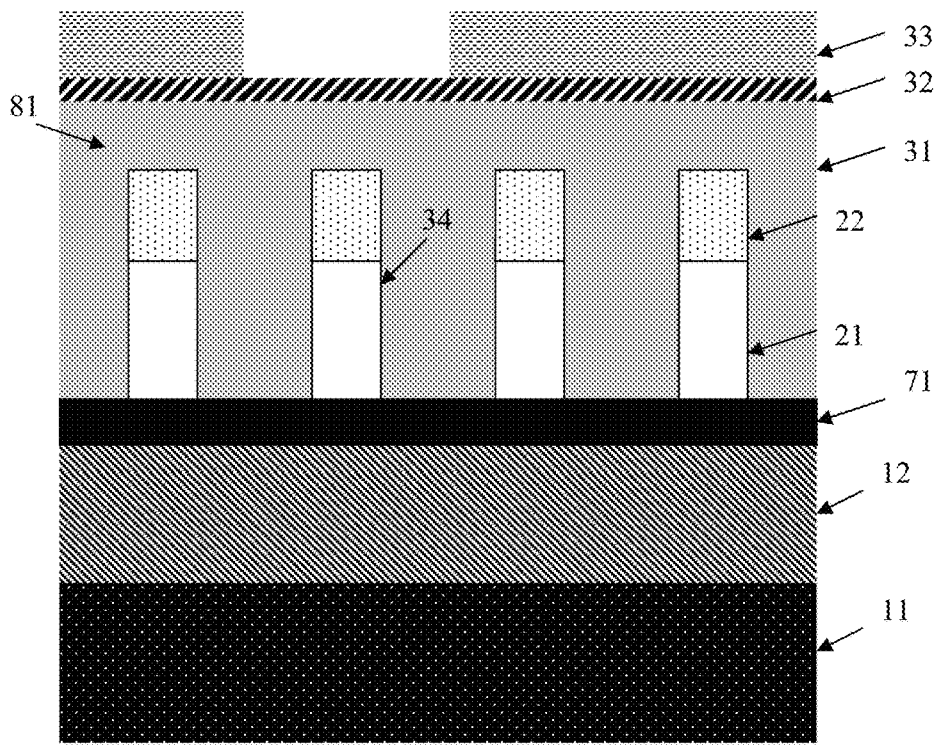
FIG. 9 shows an embodiment of the present invention after materials have been deposited in preparation for application of processes to pattern the fin-array.

Referring to FIG. 9, the fin-array 81 as shown in FIG. 8, is illustrated as having had various layers of additional layers of material 31, 32, 33, deposited by further semiconductor device fabrication processes, known in the art, as needed to prepare the fin-array 81 to be patterned by removing any of the fins 21 that are un-needed fins 34.

In a preferred embodiment the additional layers are an optical planarization layer (OPL) 31, a silicon antireflective coating (SiARC) layer 32, and a patterned photoresist layer 33. The patterned photoresist layer is utilized in part of the patterning process for exposing the OPL layer 31 and SiARC layer 32 to conventional vertical anisotropic etching processes, such as a tri-layer litho open process.

Figure 10:
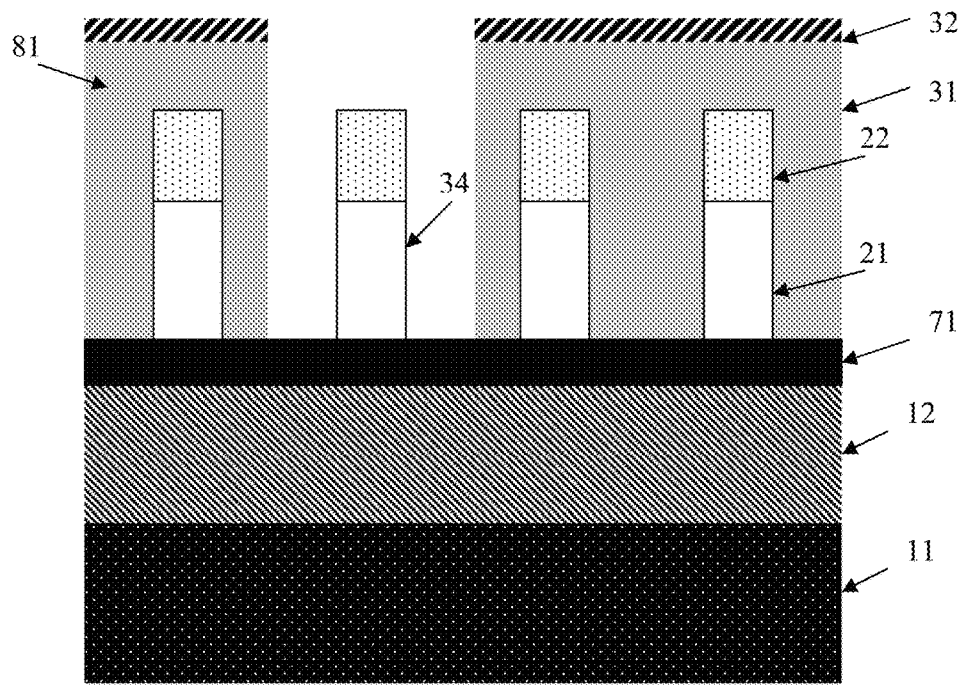
FIG. 10 shows an embodiment of the present invention after some of the processes for patterning the fin-array have uncovered the unneeded fins.

Referring to FIG. 10, the unneeded fins 34 of fin-array 81 have been uncovered by applying conventional anisotropic etching processes to the additional layers 31, 32 and 33, as part of the process for patterning the fin-array 81 without damaging the insulator layer 12 or the etch stop layer 71. In accordance with an embodiment of the present invention, a method for preventing damage to the insulator layer of a semiconductor device during creation of a fin field effect transistor device includes patterning the fin-array 81 by applying patterning processes to the material stack 72 and the etch stop layer 71 is resistant to those processes of the patterning processes that the etch stop layer 71 is exposed to, such that the etch stop layer 71 and the insulator 12 are not damaged during patterning of the fin-array 81.

In a preferred embodiment exposing the unneeded fins 34 through selective removal of the SiARC layer 32 and the OPL layer 33 can be achieved utilizing reactive ion etching (ME).

Figure 11:
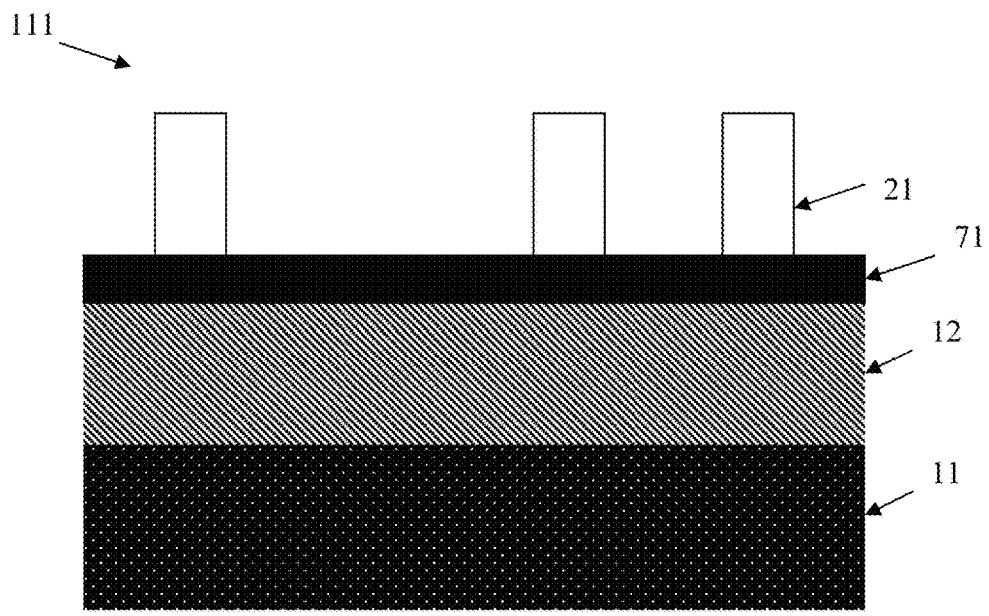
FIG. 11 shows an embodiment of the present invention after the processes for forming and patterning a fin-array have been applied and is also representative of a formed and patterned fin-array that has had processes applied for gate formation.

Referring to FIG. 11, multiple processes known in the art have been applied to remove the uncovered fin, and the additional layers 31, 32, and 33, as well as the hard mask caps 22, to form a patterned fin-array 111 without damaging the insulator layer 12 or the etch stop layer 71. In accordance with an embodiment of the present invention, a method for preventing damage to the insulator layer 12 of a semiconductor device during creation of a fin field effect transistor device includes patterning the fin-array 81 by applying patterning processes to the material stack 72 and the etch stop layer 71 is resistant to those processes of the patterning processes that the etch stop layer 71 is exposed to, such that the etch stop layer 71 and the insulator 12 are not damaged during patterning of the fin-array 71.

In a preferred embodiment the applied processes resulted in SiARC layer 32 burnoff, OPL layer 31 strip, hard mask 22 etch, and removal of the uncovered fins. Any process, or combination of processes, known in the art may be used, including but not limited to, reactive ion etching (ME), ashing, and wet etching. However, the processes capable of being utilized are those having a chemistry suitable for removing the additional layers 31, 32, 33 and unneeded fins 34, such that the etch stop layer 71 of HfO$_2$ is able to resist the processes and prevent the insulator layer 12 of SiO$_2$ from being damaged. For example, SiARC layer 32 burnoff and fin hard mask 22 etching stop on the etch stop layer 61. Similarly, cutting of the unneeded fins 34, preferably through reactive ion etching, stops on the etch stop layer 71, OPL layer 31 ashing stops on the etch stop layer 71, and stripping of the hard mask layer 22, which is on the fins 21 forming the patterned fin-array 81, by wet or dry etching also stops on the etch stop layer 71. Unlike in the prior art, the processes utilized to remove all unneeded fins 34 and additional material layers of photo-resist mask 33, Si Arc 32, and OPL 31, did no reach the insulator layer 12 of SiO$_2$ and stopped at the etch stop layer 71 of HfO$_2$. As such, gouging the insulator layer 12 of SiO$_2$ was prevented by employing a non-sacrificial etch-stop layer 71.

Furthermore, additional processes known in the art will likely be applied to accomplish gate formation (not shown) as part of fabricating FinFET devices, and some of these additional processes can result in undercut to develop at the interface of the fin 21 and insulator 12. In accordance with an embodiment of the present invention, a method for preventing damage to the insulator layer 12 of a semiconductor device during creation of a fin field effect transistor device includes fabricating a FinFET device by applying processes to the patterned fin-array 111 and the etch stop layer 71 is resistant to those processes of the FinFET fabricating processes that the etch stop layer 71 is exposed to, such that the etch stop layer 71 and the insulator 12 are not damaged during patterning of the fin-array 71.

In a preferred embodiment, the processes applied to accomplish gate formation have chemical properties that the etch stop layer 71 is resistant to. As a result insulator layer 12 is not partially removed due to gate formation processes and developing undercut at the fin 21 and insulator layer 12 interface does not occur, such that the fin 21 insulator layer 12 interface remains as shown in FIG. 11. As such, undercutting the fins 21 is prevented by including a non-sacrificial etc-stop layer 71 possessing desired material properties in the material stack.

Figure 12:
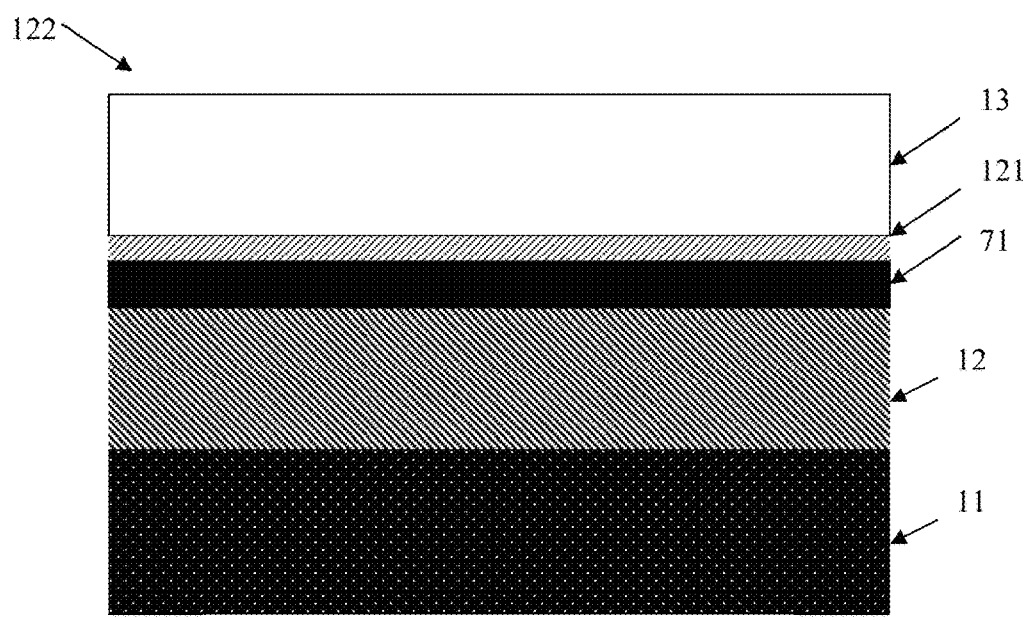
FIG. 12 shows an embodiment of the present invention prior to application of process for forming a fin-array, which involves an additional material layer to increase electrical properties of the resulting semiconductor devices.
Figure 13:
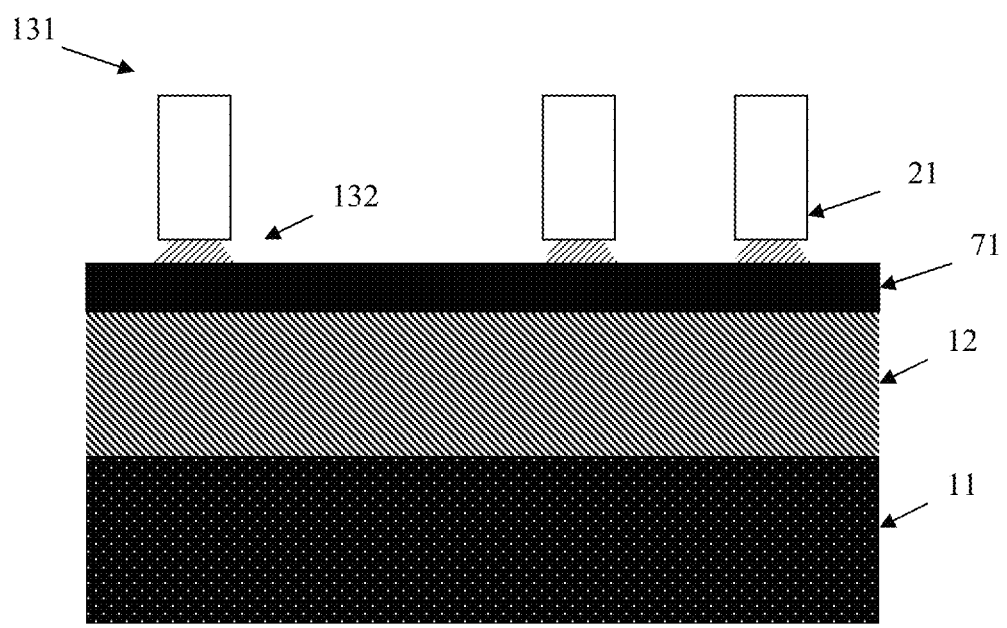
FIG. 13 shows an embodiment of the present invention after the process for forming and patterning a fin-array have been applied, which involves an additional material layer to increase the electrical properties of the resulting semiconductor devices.

FIGS. 12-13 illustrate another embodiment of the present invention involving an interfacial layer for improving the electrical properties of the resulting semiconductor devices.

Referring to FIG. 12, another embodiment is presented as a material stack 122 having an interfacial layer 121 between the active semiconductor layer 13 and the etch stop layer 71. The interfacial layer may be desired in order to improve the electrical property of the interface between the resulting fins and the layer of material the fins are in contact with, shown as interfacial layer 121. In order to improve the electrical property of the interface, the interfacial layer 121 should be of a material having electrical properties similar to the insulator layer 12, such as $SiO_2$. Furthermore, it is preferred that the interfacial layer 121 be of substantially thin thickness, so that any resulting undercut will be limited to the thickness of the interfacial layer 121, which would be a significant improvement to the prior art and as such likely result in an improvement in fin stability and electrical performance. The material and thickness of the interfacial layer 121 may vary depending on the desired result, however the preferred thickness is approximately 1 nanometer.

Referring to FIG. 13, an embodiment of the present invention is illustrated having interfacial layer 121 between the patterned fin-array 131 and the etch stop layer 71. The undercut 132 resulting from cleans, known in the art to be applied in preparation for epitaxy growth and gate formation, is substantially less than the undercut as would have resulted in the prior art, for comparison see undercut 51 as shown in FIG. 5, because the interfacial layer 121 is sufficiently thin enough to substantially reduces the resulting undercut 132.

From the foregoing, it is to be appreciated that FinFET devices may be formed having undamaged insulator layers and no undercut. Such FinFET devices may be fabricated in fewer processing operations by replacing processes and utilizing other semiconductor device fabrication techniques and materials, while utilizing the core elements of the present invention to prevent the insulator layer from being damaged and prevent undercuts from developing.

While at least one preferred embodiment has been presented in the foregoing detailed description of the invention it should be appreciated that a vast number of variations exist. It should also be appreciated that the exemplary embodiments are only examples, and are not intended to limit the scope, applicability, or configuration of the invention in any way. Rather, the foregoing detailed description will enable those skilled in the art to implement the invention, it being understood that various changes may be made in the selection and arrangement of processes and elements described without departing from the scope of the invention as set forth in the claims and their legal equivalents.

The invention claimed is:

1. A method for preventing damage to the insulator layer of a semiconductor device during fabrication of fin field effect transistor (FinFET) devices, the method comprising:
    obtaining a material stack comprising an active semiconductor layer, an insulator layer, and an etch stop layer existing between the active semiconductor layer and the insulator layer;
    forming a fin-array from the active semiconductor layer by applying fin-array formation processes to the material stack, with the etch stop layer resistant to those fin-array formation processes that the etch stop layer is exposed to, such that the etch stop layer and the insulator layer are not damaged during fin-array formation;
    patterning the fin-array by applying fin-array patterning processes after the fin-array has been formed from the active semiconductor layer, with the etch stop layer resistant to those fin-array patterning processes that the etch stop layer is exposed to, such that the etch stop layer and the insulator layer are not damaged during fin-array patterning; and
    fabricating a FinFET device by applying FinFET fabrication processes after the fin-array has been patterned by the fin-array patterning processes, with the etch stop layer resistant to those FinFET fabrication processes that the etch stop layer is exposed to, such that the etch stop layer and the insulator layer are not damaged during FinFET fabrication, wherein the material stack further comprises an interfacial layer between the active semiconductor layer and the etch stop layer, wherein the interfacial layer comprises a material similar to the insulator layer material.

2. The method of claim 1, wherein the etch stop layer comprises hafnium oxide ($HfO_2$).

3. The method of claim 1, wherein the etch stop layer comprises aluminum oxide ($Al_2O_3$).

4. The method of claim 1, wherein the etch stop layer comprises zirconate ($ZrO_3$).

5. The method of claim 1, wherein the etch stop layer comprises lanthanum oxide ($La_2O_3$).

* * * * *